(12) United States Patent
Nishida et al.

(10) Patent No.: US 9,723,734 B1
(45) Date of Patent: Aug. 1, 2017

(54) WATERPROOF TYPE CONTROL APPARATUS

(71) Applicants: Mitsubishi Electric Corporation, Tokyo (JP); YAZAKI CORPORATION, Tokyo (JP)

(72) Inventors: Mitsunori Nishida, Tokyo (JP); Osamu Nishizawa, Tokyo (JP); Wataru Tamura, Tokyo (JP); Keishi Jinno, Shizuoka (JP); Kouichi Ohyama, Shizuoka (JP)

(73) Assignees: Mitsubishi Electric Corporation, Chiyoda-ku, Tokyo (JP); YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/204,144

(22) Filed: Jul. 7, 2016

(30) Foreign Application Priority Data

Feb. 1, 2016 (JP) .................................. 2016-16843

(51) Int. Cl.
*H05K 5/02* (2006.01)
*H05K 5/03* (2006.01)
*H05K 5/00* (2006.01)

(52) U.S. Cl.
CPC ......... *H05K 5/0213* (2013.01); *H05K 5/0056* (2013.01); *H05K 5/0069* (2013.01); *H05K 5/0247* (2013.01); *H05K 5/03* (2013.01)

(58) Field of Classification Search
CPC .. H05K 5/0213; H05K 5/0069; H05K 5/0247; H05K 5/03
See application file for complete search history.

(56) References Cited

U.S. PATENT DOCUMENTS 6,113,407 A * 9/2000 Martin ................. H01R 13/521
439/205
6,827,232 B1 * 12/2004 Hara ................. B29C 45/14336
220/371
7,442,334 B2 * 10/2008 Hara ................. B29C 45/14639
264/241

(Continued)

FOREIGN PATENT DOCUMENTS

JP 2000-228243 A 8/2000
JP 2000228243 A * 8/2000

(Continued)

*Primary Examiner* — Hoa C Nguyen
*Assistant Examiner* — Keith Depew
(74) *Attorney, Agent, or Firm* — Sughrue, Mion, PLLC; Richard C. Turner

(57) ABSTRACT

An object is to prevent a water-repellent filter, which performs ventilation between the interior and the exterior of a sealed casing and prevents entry of water, from being wetted directly with water.

A circuit board is sealed and housed in a casing including a base and a cover, a connector housing including a partition wall is mounted on the circuit board, and an electrical connection between the interior and the exterior of the casing is established. A water-repellent filter is fixed to an inner surface of the partition wall, and an outer surface portion of the water-repellent filter is opened to atmosphere via first and second ventilation holes and first and second connection ventilation holes. Therefore, the water-repellent filter can be avoided from being wetted directly with water.

8 Claims, 9 Drawing Sheets

(56) References Cited

U.S. PATENT DOCUMENTS

| | | | | |
|---|---|---|---|---|
| 7,667,973 | B2* | 2/2010 | Shinoda | H05K 5/0047 174/50 |
| 7,744,381 | B2* | 6/2010 | Honda | H05K 5/0052 439/79 |
| 7,936,566 | B2* | 5/2011 | Shigyo | H05K 5/0052 137/14 |
| 8,014,158 | B2* | 9/2011 | Kojima | H05K 5/0052 174/50.5 |
| 8,520,397 | B2* | 8/2013 | Azumi | H05K 5/0052 361/730 |
| 8,627,564 | B2* | 1/2014 | Blossfeld | H01R 13/6658 29/592.1 |
| 8,699,231 | B2* | 4/2014 | Shinoda | H05K 5/0047 174/520 |
| 9,293,870 | B1* | 3/2016 | Koczwara | H01R 12/724 |
| 9,462,715 | B2* | 10/2016 | Nuriya | H05K 5/061 |

FOREIGN PATENT DOCUMENTS

| | | | | |
|---|---|---|---|---|
| JP | 2005150376 | A | * | 6/2005 |
| JP | 2005243829 | A | * | 9/2005 |
| JP | 2007141959 | A | * | 6/2007 |
| JP | 2011-165748 | A | | 8/2011 |
| JP | 2014164825 | A | * | 9/2014 |

* cited by examiner

WATERPROOF TYPE CONTROL APPARATUS

BACKGROUND OF THE INVENTION

Field of the Invention

TECHNICAL FIELD

The present invention relates to a waterproof type control apparatus that is, for example, an on-vehicle electronic control apparatus provided in an engine room, and particularly relates to improvement in a breath ventilation structure in which a water-repellent filter is provided between the interior of a waterproof sealed casing having a heating component housed therein and outside air to protect a waterproof sealing structure.

Description of the Related Art

BACKGROUND ART

In a waterproof type control apparatus in which a circuit board is sealed and housed in a casing that includes a base and a cover, circuit components, including a heating component, and an external wiring connector housing exposed partially from the casing are mounted on the circuit board, and a waterproof sealing material is provided on a joined surface of the base, the cover, and the connector housing, a water-repellent filter is conventionally provided to the cover or the base to release air within the casing to the atmosphere, so that deformation of a casing structure or damage of an airtight sealing structure caused due to an air pressure difference between the interior and the exterior of the casing based on an increase in the temperature of the heating component within the casing, is prevented.

The water-repellent filter is composed of a flat porous material including a plurality of fine pores that block entry and passing of water droplets into the casing and allow the atmospheric air to freely pass therethrough, and a mounting structure for the porous material is devised such that the porous material is not stained through wetting directly with water.

As one of widely-used forms, there is one having a water-repellent filter provided at the cover side. However, the cover is most likely to be wetted directly with water, and thus a ventilation structure for withstanding wetting directly with water poured by high-pressure washing or the like is required. This structure becomes complicated and expensive, which is a problem.

As another widely-used form, there is one having a water-repellent filter provided at a back surface portion of the base. In this case, the position of the water-repellent filter is an advantageous position where it is hard to be wetted directly with water poured by high-pressure washing. However, in the case where the base is made of a sheet metal or an aluminum die casting, there is a problem that it is difficult to bond and fix the water-repellent filter alone.

In addition, in the case were the base is made of a resin, the water-repellent filter can be fixed easily by means of heat welding, but there is a problem that heat generated within the casing cannot be transmitted and dissipated.

Meanwhile, the vicinity of the connector housing to which a wire harness is connected is a position where it is hard to be wetted directly with water, and is a most advantageous location where consideration is given to a surrounding structure.

For example, according to FIG. 1 of the "ventilation structure of waterproof case" of Patent Document 1 described below, a connector 20 of a wire harness 19 has a plurality of ventilation holes 23 formed for causing the interior of the connector 20 to communicate with the atmosphere, and a water-repellent filter 24 having air permeability and waterproofness is mounted at each of the ventilation holes 23 by means of welding. A connector 17 of a circuit board 16 housed in a waterproof case 11 has one or a plurality of communication holes 25 formed so as to provide communication between the interior of the connector 20 of the wire harness 19 and the interior of the waterproof case 11. Both the interior of the waterproof case 11 and the interior of the connector 20 are caused to communicate with the atmosphere by the ventilation holes 23 and the communication holes 25 of the connectors 20 and 17, so that water suction caused due to a negative pressure can be prevented and both a short circuit within the connector 20 and a short circuit of the circuit board 16 can be prevented.

According to FIGS. 9 and 12 of the "waterproof casing" of Patent Document 2 described below, a cover 18 of a waterproof casing 300 having an electronic board 15 housed therein is provided with a ventilation hole 20, a breathing filter 10 that includes a double-sided adhesive sealing material 11 and a filter body 12 is disposed on the outer surface of the cover 18, and a ventilation groove 26 that leads to the breathing filter 10 and has a slope is closed by a shield 24, except for an end opening of the ventilation groove 26.

Therefore, since the breathing filter includes the ventilation groove having a maze structure and the shielding body, it is not necessary to provide a plurality of ventilation holes in the casing and provide a breathing filter over two surfaces as in the conventional art. Accordingly, the breathing filter can be reduced in size to reduce the cost, and also clogging of the breathing filter can be reduced.

CITATION LIST

Patent Document

Patent Document 1: Japanese Laid-Open Patent Publication No. 2000-228243 (FIG. 1, paragraphs [0013] to [0016])

Patent Document 2: Japanese Laid-Open Patent Publication No. 2011-165748 (FIGS. 8 to 12, paragraphs [0058] to [0063])

SUMMARY OF THE INVENTION

Problems to be Solved by the Invention (1) Explanation of Problems of Conventional Arts In the "ventilation structure of the waterproof case" according to Patent Document 1 described above, the water-repellent filters 24 are mounted at the connector 20 side, and both the interior of the waterproof case 11 and the interior of the connector 20 are caused to communicate with the atmosphere, so that both a short circuit within the connector 20 and a short circuit of the circuit board 16 that are caused due to water suction are prevented.

Therefore, although each water-repellent filter 24 is provided at the location where it is hard to be wetted directly with water, since each water-repellent filter 24 is provided in a small space within the connector 20, there is a problem that the ventilation area of each water-repellent filter 24 decreases, so that an air pressure difference occurs between the interior of the waterproof case 11 and the atmosphere.

In addition, the waterproof type control apparatus itself does not include a water-repellent filter, and thus there is a problem that a functional test cannot be conducted on the apparatus alone.

In the case of the "waterproof casing" according to Patent Document 2 described above, the breathing filter 10 (corresponding to a water-repellent filter) having the ventilation hole with a maze structure is provided on a proximate back surface of an intermediate portion between connector housings 17a and 17b and at the cover 18 side, and an atmospheric opening thereof is the intermediate portion between the connector housings 17a and 17b.

Therefore, although the atmospheric opening is a location where it is hard to be wetted directly with water, the cover 18 needs an opening wall surface that is in contact with the connector housings 17a and 17b and an inner wall surface to which the breathing filter 10 is bonded and fixed and which has a ventilation hole 20, so that the cover shape is complicated. Thus, there is a problem that it is difficult to apply this cover shape to at least a cover made of a sheet metal.

In addition, depending on a direction in which the waterproof casing is mounted, the atmospheric opening may be wetted directly with water, and there is a problem that application to a use with such a mounting angle is impossible.

(2) Explanation of Objects of Invention

A first object of the present invention is to provide a water-repellent filter mounting structure with which a water-repellent filter is mounted within a waterproof type control apparatus and which can avoid an atmospheric opening from being wetted directly by water, without needing a complicated mounting structure.

A second object of the present invention is to provide a water-repellent filter mounting structure that can handle various mounting positions and mounting angles of a waterproof type control apparatus in various uses to avoid wetting directly with water.

Solution to the Problems

A waterproof type control apparatus according to the present invention includes: a circuit board sealed and housed in a casing including a cover and a base having a mounting surface; a connector housing which is a resin molded member mounted at one side of the circuit board and exposed from a side surface opening of the cover; and a plurality of first connection terminals press-fitted into a partition wall of the connector housing, wherein: one end of each first connection terminal is connected to a circuit pattern of the circuit board, and another end of each first connection terminal is connected in a contact conductive manner to a second connection terminal provided within a mating connector, so that the waterproof type control apparatus is connected to a wire harness which is outside the casing; the connector housing includes an inner annular peripheral wall provided at an inner side of the partition wall, and an outer annular peripheral wall which is provided at an outer side of the partition wall and to which the mating connector is fitted; and a waterproof packing for preventing water from entering an closed space including a contact conductive portion between each first connection terminal and each second connection terminal is provided between an end surface portion of the outer annular peripheral wall and the mating connector fitted to the outer annular peripheral wall.

In addition, a water-repellent filter which is a flat porous material including a plurality of fine pores which block entry and passing of water droplets into the casing and allow atmospheric air to freely pass therethrough is fixed in a close contact manner to an inner surface of the partition wall; the water-repellent filter includes an inner surface portion communicating with an inner space of the casing and an outer surface portion communicating with a breath ventilation hole through which outside air is introduced; the breath ventilation hole extends within a ventilation wall provided at a position at a side surface of the outer annular peripheral wall, in a direction penetrating the partition wall, is changed in direction to a direction to the mounting surface, which direction is parallel to the partition wall, or a direction opposite to the direction to the mounting surface by a connection ventilation hole, and is opened to atmosphere; and a product in which the direction changed by the connection ventilation hole is the direction to the mounting surface or the direction opposite to the direction to the mounting surface is selected and used depending on a mounting environment of the base such that wetting directly with water through an atmospheric opening is unlikely to occur.

Effect of the Invention

In the waterproof type control apparatus according to the present invention, since the water-repellent filter is mounted on the inner surface of the connector housing, a functional test can be conducted on the apparatus alone, and also there is an effect that the area of the water-repellent filter can be increased to reduce the air pressure difference between the interior and the exterior, as compared to the case where the water-repellent filter is provided within the mating connector.

In addition, the mounting structure becomes simpler and cheaper than conventional one in which a water-repellent filter is provided to a specially provided intermediate wall of a cover, so that there is an effect that a cover made of a resin or a sheet metal can be used.

Moreover, as the direction changed by the connection ventilation hole, the direction to the mounting surface or the direction opposite to the direction to the mounting surface can be used when a position where an insert mold is inserted is changed, so that there is an effect that it is possible to handle the mounting environment such that wetting directly with water from an atmospheric opening surface is easily avoided.

DETAILED DESCRIPTION OF THE PREFERRED EMBODIMENTS

Embodiment 1

(1) Detailed Description of Configuration

Figure 4:
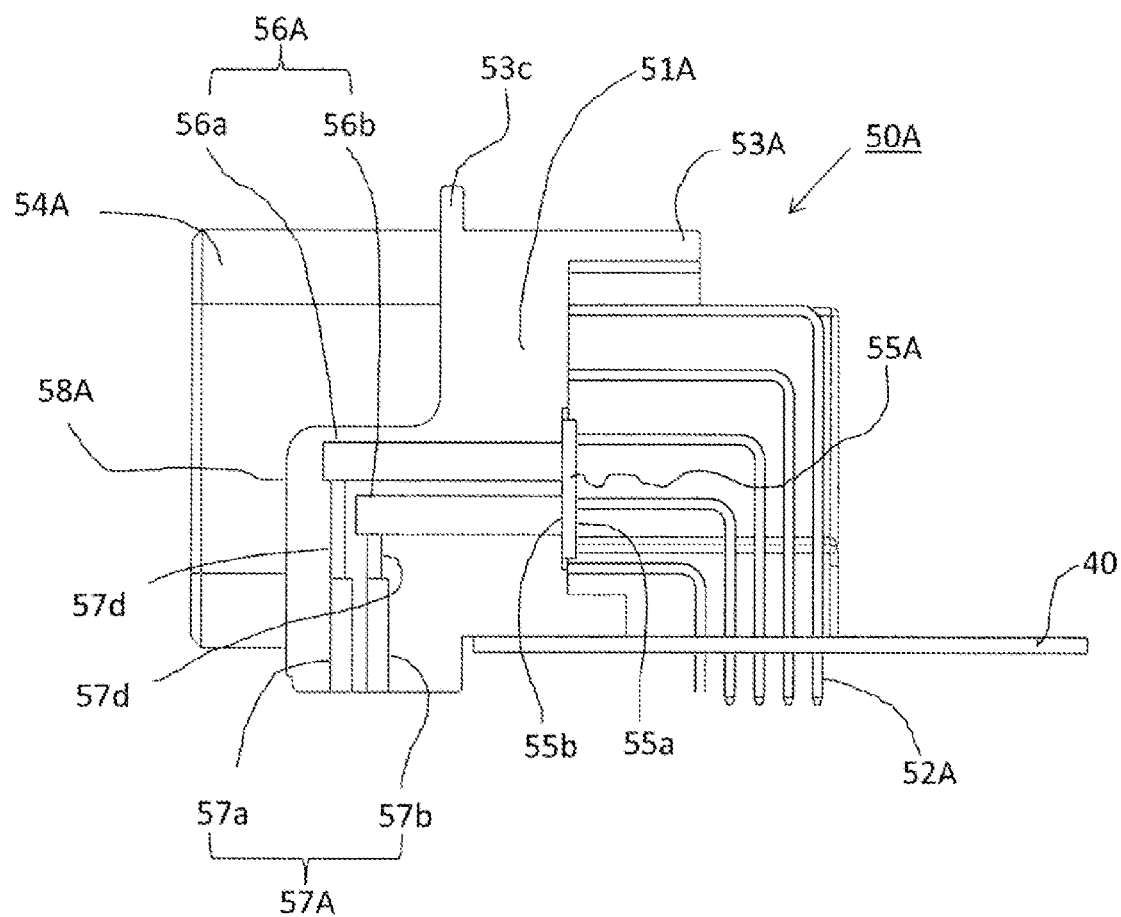
FIG. 4 is a detailed cross-sectional view of a connector housing in FIG. 1.

In an external view of a waterproof type control apparatus 10A in FIG. 1, a casing 11A includes: a base 20A that has mounting legs at four sides thereof and is made of an aluminum die casting or a sheet metal; and a cover 30A that is made of a resin or a sheet metal, a circuit board 40 on which a connector housing 50A described later with reference to FIG. 4 is mounted is sealed and housed in the casing 11A, and a part of the connector housing 50A and a ventilation wall 58A are exposed from the casing 11A.

A mating connector 12A is inserted to the exposed part of the connector housing 50A so as to establish a connection with an external apparatus via a wire harness 60A.

Figure 1:
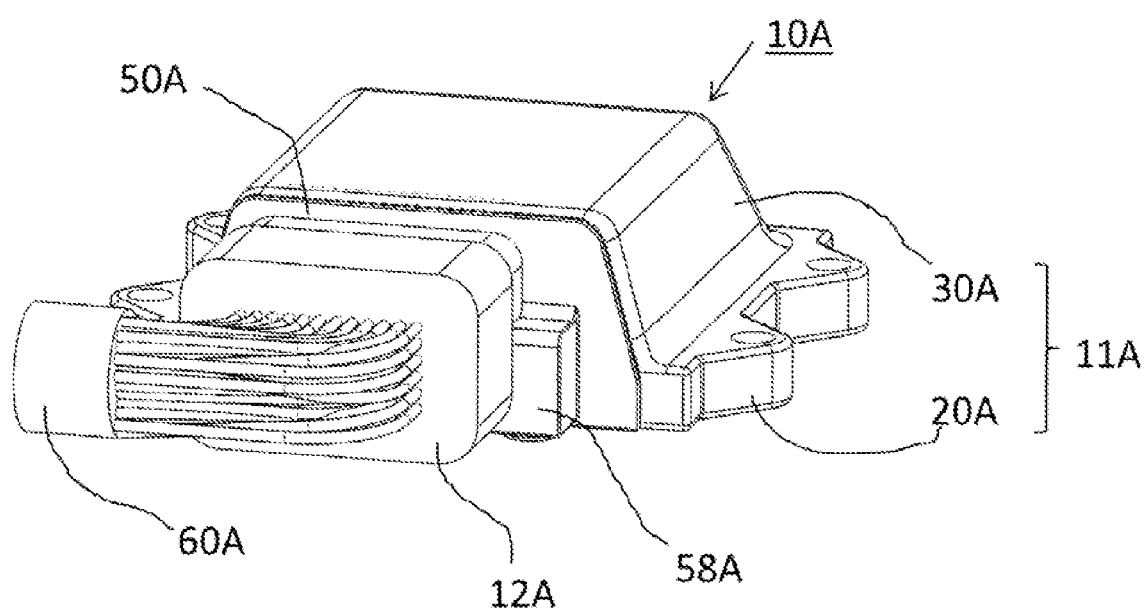
FIG. 1 is an external view of a waterproof type control apparatus according to Embodiment 1 of the present invention.
Figure 2:
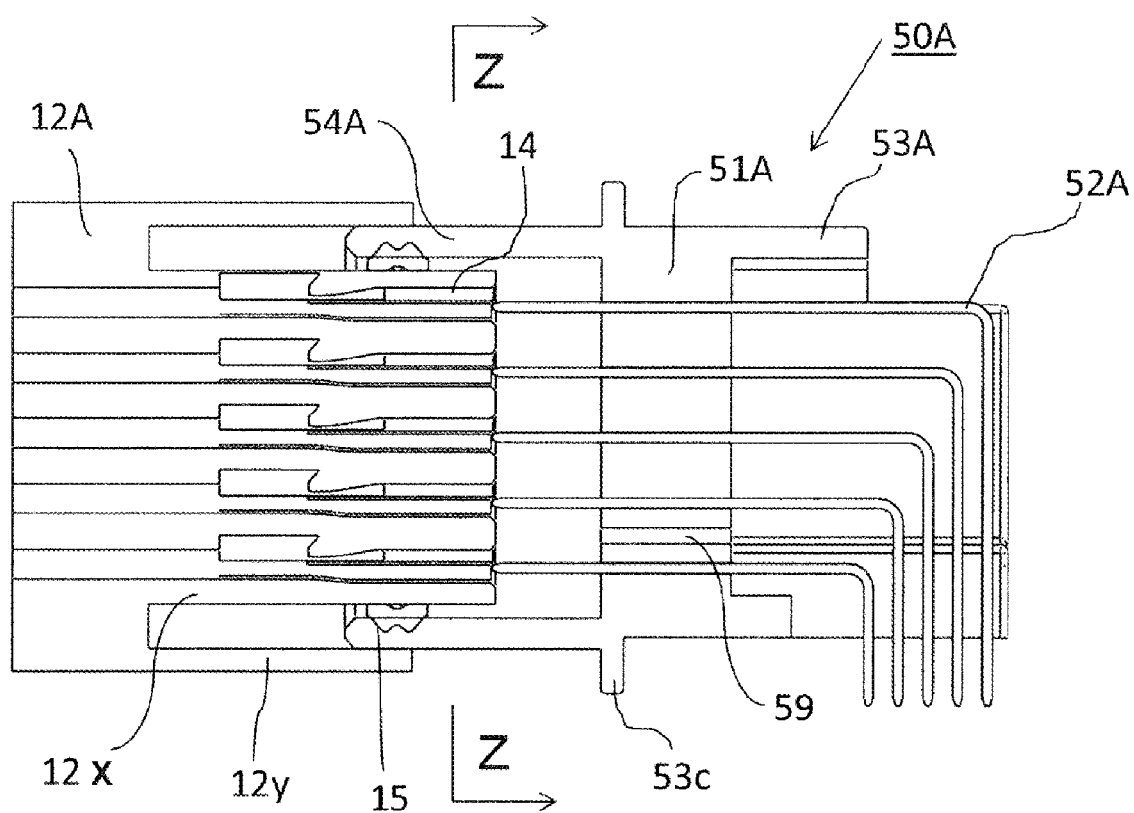
FIG. 2 is a cross-sectional view of a connector connection portion in FIG. 1.

FIG. 2 is a cross-sectional view of a connector connection portion in FIG. 1. In FIG. 2, the connector housing 50A, which is made of the resin, includes an inner annular peripheral wall 53A and an outer annular peripheral wall 54A that are provided laterally to a partition wall 51A, and is configured such that the mating connector 12A is attached to the outer annular peripheral wall 54A that is at the side of exposure from the casing 11A.

Three sides of the outer periphery of the inner annular peripheral wall 53A are in contact with an opening surface of the cover 30A in FIG. 1 via a waterproof sealing material that is not shown, the remaining one side of the outer periphery is in contact with one side of the base 20A via the waterproof sealing material that is not shown, and an annular projection 53c for preventing outflow of the waterproof sealing material is provided at a position where the interior and the exterior are separated by the partition wall 51A.

A plurality of first connection terminals 52A are press-fitted and fixed to the partition wall 51A, and each are configured such that one end thereof is orthogonally converted and soldered to the circuit board 40 described later with reference to FIG. 4, and the other end thereof is brought into electrically conductive contact with a second connection terminal 14 provided in the mating connector 12A.

The partition wall 51A is provided with a fine hole 59 that provides communication between the inner space of the casing 11A and a sealed space at the connector side.

The mating connector 12A has an annular space defined by: an inner body portion 12x into which a plurality of second connection terminals 14 are inserted; and an outer peripheral wall 12y surrounding the inner body portion 12x, and is configured such that the outer annular peripheral wall 54A of the connector housing 50A is inserted into the annular space.

A waterproofing mechanism that is not shown is provided at a position where the mating connector 12A and the wire harness 60A in FIG. 1 are received, and waterproofness between the mating connector 12A and the connector housing 50A is provided by a waterproof packing 15 that is disposed on the inner peripheral surface of the outer annular peripheral wall 54A and the outer periphery of the inner body portion 12x.

Figure 3:
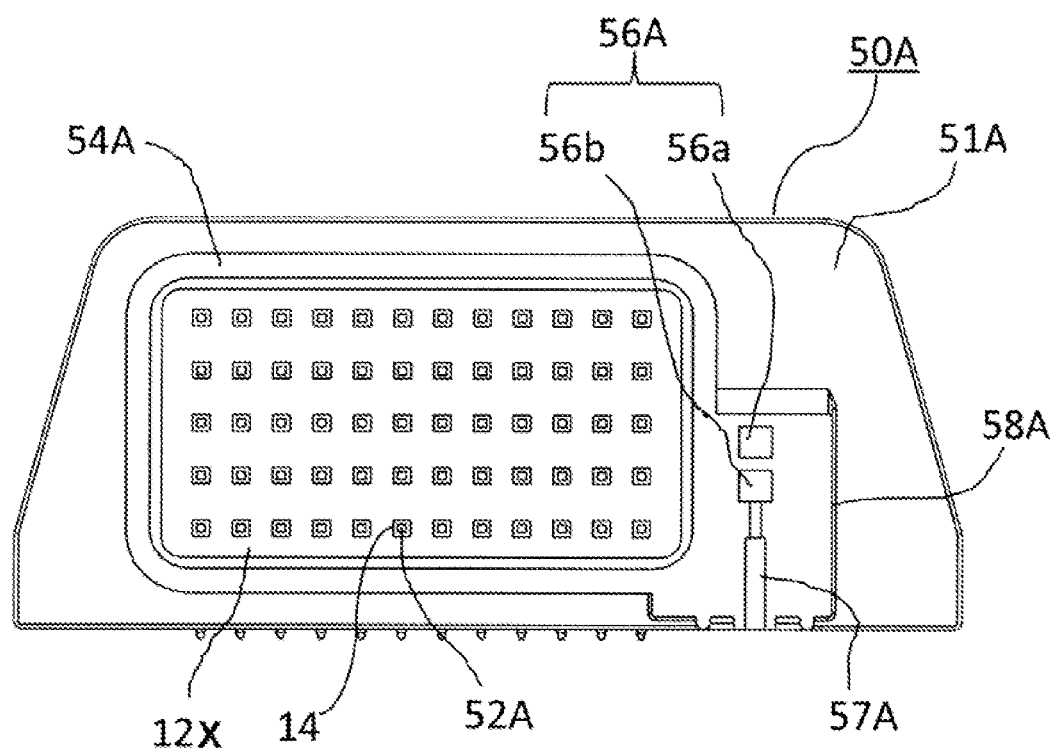
FIG. 3 is a cross-sectional view taken along a Z-Z line in FIG. 2.

FIG. 3 is a cross-sectional view taken along a Z-Z line in FIG. 2. In FIG. 3, the plurality of second connection terminals 14 described above with reference to FIG. 2 are inserted into the inner body portion 12x of the mating connector 12A, and the first connection terminals 52A are further inserted into the second connection terminals 14.

Although the outer peripheral wall 12y of the mating connector 12A is present on the outer periphery of the outer annular peripheral wall 54A, the position of the cross-section taken along the Z-Z line is a position where the outer peripheral wall 12y is not present.

Within the ventilation wall 58A that projects outward from the partition wall 51A of the connector housing 50A, a breath ventilation hole 56A including first and second ventilation holes 56a and 56b described later with reference to FIG. 4 is provided, and a connection ventilation hole 57A (see FIG. 4 described later) including first and second connection ventilation holes 57a and 57b at the respective ventilation holes is provided. However, either one of the first and second ventilation holes 56a and 56b may be omitted. Accordingly, either one of the first and second connection ventilation holes 57a and 57b may be omitted.

The first and second ventilation holes 56a and 56b are arranged in the up-down direction, but may be arranged in the right-left direction.

FIG. 4 is a detailed cross-sectional view of the connector housing in FIG. 1. In FIG. 4, the connector housing 50A is fixed to one side of the circuit board 40, and the plurality of right-angle-type first connection terminals 52A are soldered thereto.

A water-repellent filter 55A is bonded and fixed to an inner wall surface of the partition wall 51A of the connector housing 50A to which the plurality of first connection terminals 52A are press-fitted and fixed, and is a flat porous material that has an inner surface portion 55a and an outer surface portion 55b and has a circular shape, a square shape, or an elliptical shape.

The inner surface portion 55a of the water-repellent filter 55A is fully opened to the inner space of the casing 11A, and the outer surface portion 55b is fully opened to the breath ventilation hole 56A, which is provided in the partition wall 51A and includes the first and second ventilation holes 56a and 56b, except for a contour outer peripheral portion of the outer surface portion 55b.

The first ventilation hole 56a is opened to the atmosphere via a throttling hole portion 57d orthogonal thereto and the second connection ventilation hole 57a, the second ventilation hole 56b is opened to the atmosphere via a throttling hole portion 57d orthogonal thereto and the second connection ventilation hole 57b, and the first and second connection ventilation holes 57a and 57b form the connection ventilation hole 57A. The opening of the connection ventilation hole 57A in Embodiment 1 is opposed to the same plane as a mounting surface of the base 20A, and the apparatus having this configuration is referred to as "regular product". When the direction of an insert of a mold for manufacturing the connector housing 50A is made opposite, a "mirror-image product" can be produced in which the opening of the connection ventilation hole 57A is opposed to a plane in a direction opposite to the mounting surface of the base 20A (i.e., a direction to the cover 30A).

In the present embodiment, the breath ventilation hole 56A is structured to extend in a direction orthogonal to the partition wall 51A and change its direction to an upward or downward direction parallel to the partition wall 51A by the connection ventilation hole 57A. However, as long as wetting with water can be prevented, the angle between the breath ventilation hole 56A and the connection ventilation hole 57A is not limited to the right angle.

(2) Detailed Description of Effects and Operation

Next, effects and operation of the waterproof type control apparatus 10A of Embodiment 1 will be described.

In FIGS. 1 and 4, a heating component that is not shown is mounted on the circuit board 40 that is sealed and housed in the casing 11A. When an air pressure difference occurs based on the temperature difference between the interior and the exterior of the casing, the air within the casing 11A is breathed via the water-repellent filter 55A, the breath ventilation hole 56A, and the connection ventilation hole 57A, so that deformation of the casing 11A is prevented, or occurrence of crack and separation of the waterproof sealing material between the base 20A and the cover 30A or the waterproof sealing material between the connector housing 50A and the base 20A or the cover 30A, is prevented.

In a connector space that is sealed by the connector housing 50A and the mating connector 12A and includes the portion where each first connection terminal 52A and each second connection terminal 14 are in electrically conductive contact with each other, breathing is performed via the fine hole 59 (see FIG. 2) and the inner space of the casing 11A.

Figure 5:
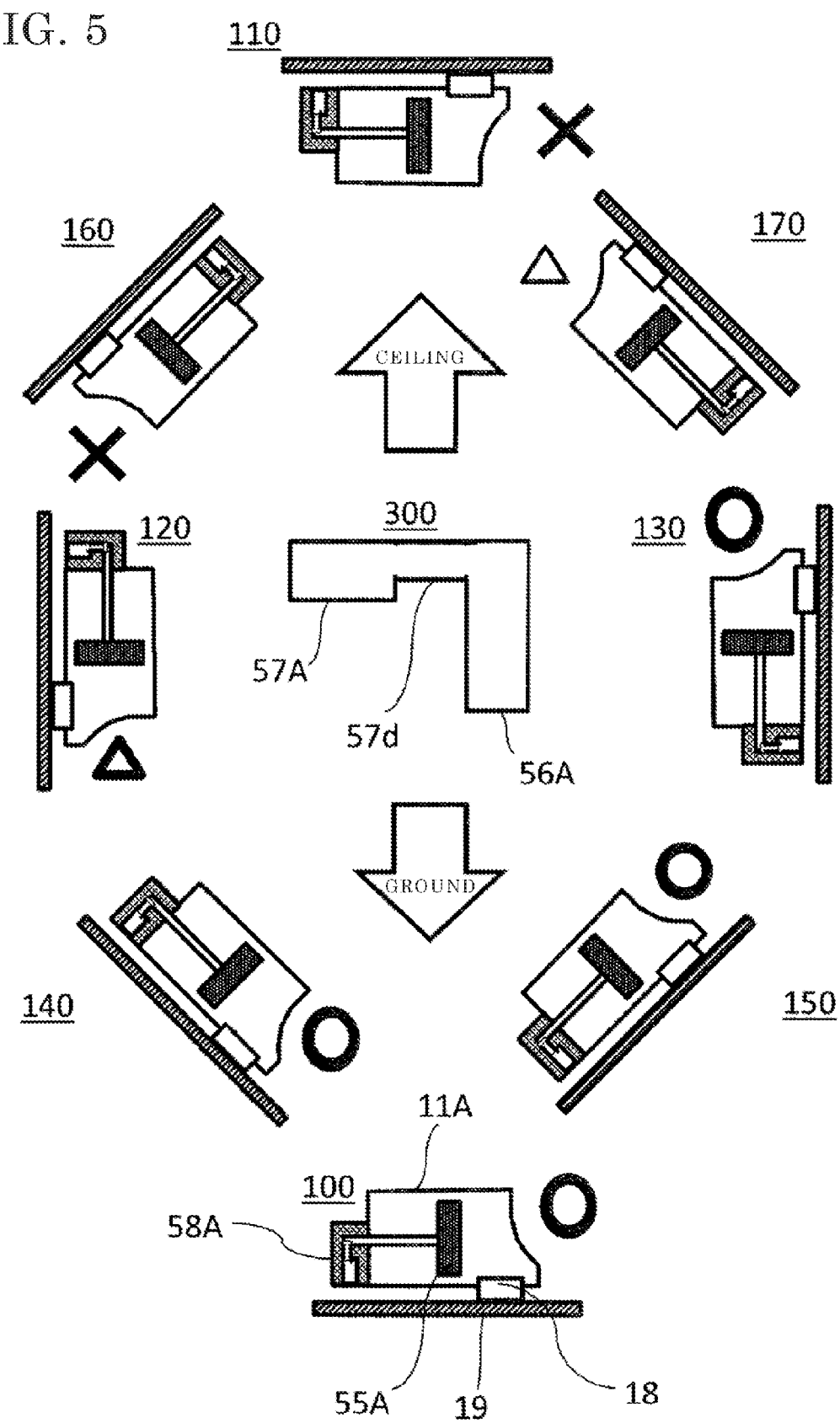
FIG. 5 is an explanatory diagram showing positions of an opening of a connection ventilation hole with respect to various mounting angles of the apparatus in FIG. 1.

FIG. 5 is an explanatory diagram showing positions of the opening of the connection ventilation hole 57A with respect to various mounting angles regarding the "regular product" shown in FIG. 1. With reference to this drawing, the mounting direction of the waterproof type control apparatus 10A and whether the water-repellent filter 55A is wetted with water will be described in detail.

"○", "x", "Δ" shown in FIG. 5 simply indicate appropriateness of a mounting manner.

In FIG. 5, a diagram 100 schematically shows a case where the "regular product" is mounted on a floor surface such as the upper surface of a shelf board, the casing 11A is fixed to a mounted surface 19 that is a horizontal floor surface, via a mounting leg 18 of the casing 11A, and the breath ventilation hole 56A, the throttling hole portion 57d, and the connection ventilation hole 57A are provided within the ventilation wall 58A and with respect to the water-repellent filter 55A included in the casing 11A, and the opening of the connection ventilation hole 57A is opposed to the mounted surface 19.

Therefore, water poured over the floor surface by high-pressure washing or the like is not poured directly over the opening of the connection ventilation hole 57A. Even when the poured water flowing on the floor surface reaches the opening, since the connection ventilation hole 57A becomes an upward hole, the water is not poured to the breath ventilation hole 56A or the water-repellent filter 55A.

In FIG. 5, a diagram 110 schematically shows a case where the "regular product" is mounted on a ceiling surface such as the lower surface of a shelf board. Poured water that is splashed back to the ceiling surface flows into the opening of the connection ventilation hole 57A and is poured to the breath ventilation hole 56A and the water-repellent filter 55A. Thus, this mounted position is inappropriate.

In the case of mounting on the ceiling surface, it is conceivable that wetting directly with water poured by high-pressure washing is prevented by the shelf board itself or some sort of an obstacle.

In FIG. 5, a diagram 120 schematically shows a case where the "regular product" is mounted on a vertical wall surface. Since the ventilation wall 58A is located at the upper side, when water poured over the wall surface flows into the opening of the connection ventilation hole 57A, the water-repellent filter 55A is wetted with the water. However, as shown in a diagram 300 in FIG. 5, when the connection ventilation hole 57A is made to have a large diameter and the throttling hole portion 57d having a small diameter is provided at an upper eccentric position on the connection ventilation hole 57A, a small amount of water does not flow into the throttling hole portion 57d, and therefore, the water-repellent filter 55A is not wetted with water.

In FIG. 5, a diagram 130 schematically shows a case where the "regular product" is mounted on a vertical wall surface. There is a possibility that water poured over the wall surface flows into the opening of the connection ventilation hole 57A.

However, in this case, the ventilation wall 58A is located at the lower side, and the breath ventilation hole 56A becomes an upward hole. Thus, the water-repellent filter 55A is not wetted with water.

In FIG. 5, a diagram 140 schematically shows a case where the "regular product" is mounted on an inclined floor surface with the ventilation wall 58A located at the upper side. Water poured over the inclined floor surface flows past the opening of the connection ventilation hole 57A. However, since the connection ventilation hole 57A becomes an upward hole, the water does not flow into the connection ventilation hole 57A, and thus the water-repellent filter 55A is not wetted by the water.

In FIG. 5, a diagram 150 schematically shows a case where the "regular product" is mounted on an inclined floor surface with the ventilation wall 58A located at the lower side. Water poured over the inclined floor surface flows past the opening of the connection ventilation hole 57A. However, since both the connection ventilation hole 57A and the breath ventilation hole 56A become upward holes, the water-repellent filter 55A is not wetted with the water.

In FIG. 5, a diagram 160 schematically shows a case where the "regular product" is mounted on an inclined ceiling surface with the ventilation wall 58A located at the upper side. Water poured over the inclined ceiling surface flows through the connection ventilation hole 57A and the breath ventilation hole 56A into the water-repellent filter 55A. Thus, this mounted position is inappropriate.

In FIG. 5, a diagram 170 schematically shows a case where the "regular product" is mounted on an inclined ceiling surface with the ventilation wall 58A located at the lower side. Water poured over the inclined ceiling surface flows past the opening of the connection ventilation hole 57A, and flows into the connection ventilation hole 57A at this time. However, since the breath ventilation hole 56A becomes an upward hole, the water-repellent filter 55A is not wetted with the water. However, the water having flowed into the connection ventilation hole 57A needs to wait to be evaporated to the outside due to a rise in the temperature of the waterproof type control apparatus 10A or a rise in the environmental temperature. Thus, this mounted position is not desirable.

Figure 6:
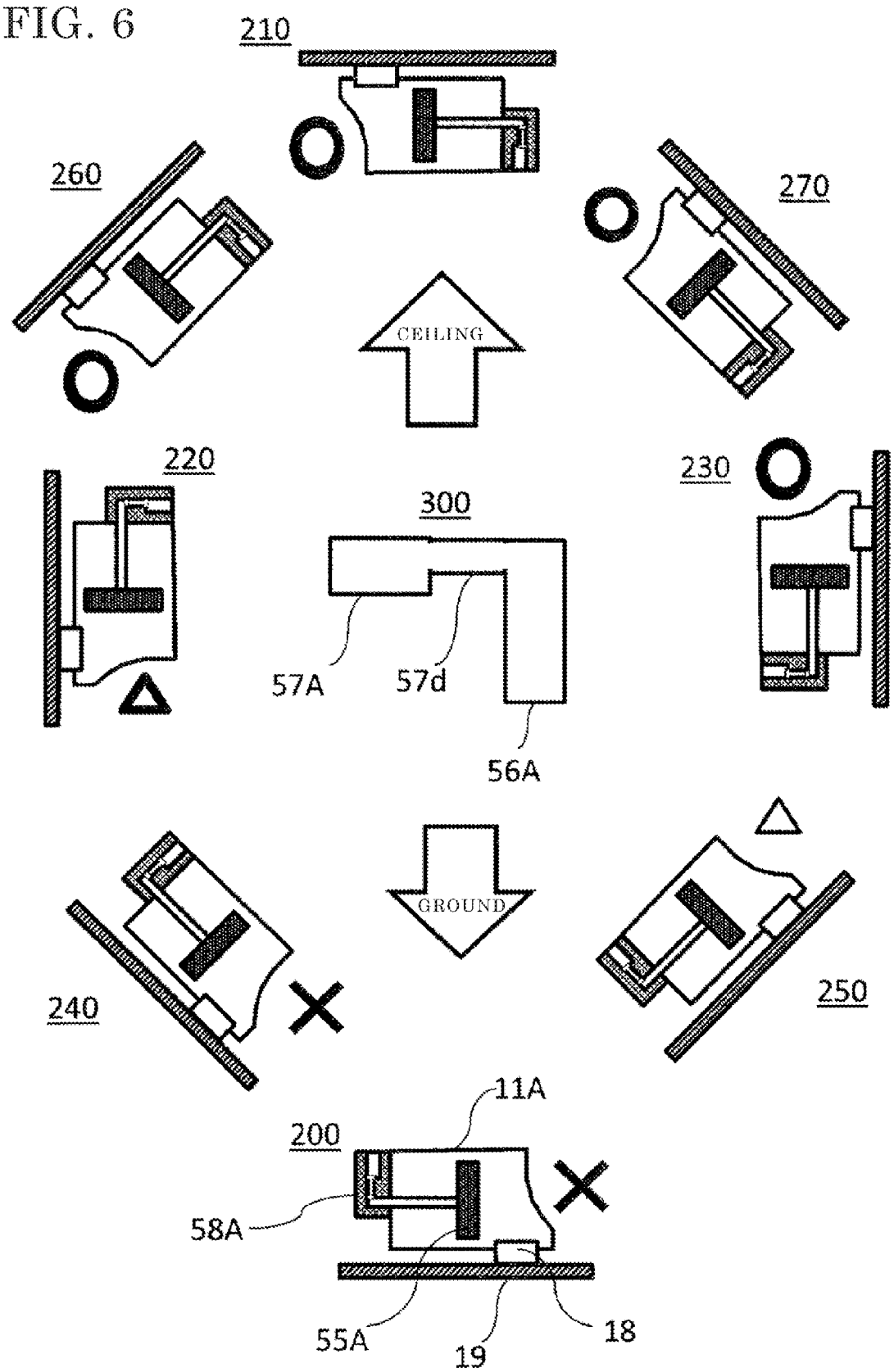
FIG. 6 is an explanatory diagram showing positions of an opening of connection ventilation hole with respect to various mounting angles regarding a "mirror-image product" for the apparatus in FIG. 1.

FIG. 6 is an explanatory diagram showing positions of the opening of the connection ventilation hole 57A with respect to various mounting angles regarding the "mirror-image product" for the "regular product" in FIG. 1. "○", "x", "Δ" shown in FIG. 6 simply indicate appropriateness of a mounting manner, similarly as in FIG. 5.

In FIG. 6, a diagram 200 schematically shows a case where the "mirror-image product" in which the direction of the connection ventilation hole 57A is made opposite to that in the "regular product" is mounted on a floor surface, the casing 11A is fixed to the mounted surface 19 that is a horizontal floor surface such as the upper surface of a shelf board, via the mounting leg 18 of the casing 11A, the breath ventilation hole 56A, the throttling hole portion 57d, and the connection ventilation hole 57A are provided within the ventilation wall 58A and with respect to the water-repellent filter 55A included in the casing 11A, and the atmospheric opening of the connection ventilation hole 57A faces in a direction opposite to the mounted surface 19.

Therefore, water poured in a direction to the floor surface by high-pressure washing or the like is directly poured over the opening of the connection ventilation hole 57A, and also flows into the breath ventilation hole 56A and the water-repellent filter 55A since the connection ventilation hole 57A becomes a downward hole. Thus, this mounted position is inappropriate.

In FIG. 6, a diagram 210 schematically shows a case where the "mirror-image product" is mounted on a ceiling surface such as the lower surface of a shelf board. Poured water that is splashed back to the ceiling surface is poured over the opening of the connection ventilation hole 57A. However, since the connection ventilation hole 57A becomes an upward hole, the water is not poured to the breath ventilation hole 56A or the water-repellent filter 55A.

In the case of mounting on the ceiling surface, it is conceivable that wetting directly with water poured by high-pressure washing is prevented by the shelf board itself or some sort of an obstacle.

In FIG. 6, a diagram 220 schematically shows a case where the "mirror-image product" is mounted on a vertical wall surface. Since the ventilation wall 58A is located at the upper side, when poured water flows into the opening of the connection ventilation hole 57A, the water-repellent filter 55A is wetted with the water. However, as shown in a diagram 300 in FIG. 6, when the connection ventilation hole 57A is made to have a large diameter and the throttling hole portion 57d having a small diameter is provided at an upper eccentric position on the connection ventilation hole 57A, a small amount of water does not flow into the throttling hole portion 57d, and therefore, the water-repellent filter 55A is not wetted with water.

In FIG. 6, a diagram 230 schematically shows a case where the "mirror-image product" is mounted on a vertical wall surface. In this case, since the ventilation wall 58A is located at the lower side and the breath ventilation hole 56A becomes an upward hole, even when water is poured over the opening of the connection ventilation hole 57A, the water-repellent filter 55A is not wetted with the water.

In FIG. 6, a diagram 240 schematically shows a case where the "mirror-image product" is mounted on an inclined floor surface with the ventilation wall 58A located at the upper side. Water poured over the opening of the connection ventilation hole 57A by high-pressure washing or the like flows into the connection ventilation hole 57A and the breath ventilation hole 56A that become downward holes, and the water-repellent filter 55A is wetted with the water. Thus, this mounted position is inappropriate.

In FIG. 6, a diagram 250 schematically shows a case where the "mirror-image product" is mounted on an inclined floor surface with the ventilation wall 58A located at the lower side. Water poured over the opening of the connection ventilation hole 57A by high-pressure washing or the like flows into the connection ventilation hole 57A. However, since the breath ventilation hole 56A becomes an upward hole, the water-repellent filter 55A is not wetted with the water. However, the water having flowed into the connection ventilation hole 57A needs to wait to be evaporated due to a rise in the temperature of the waterproof type control apparatus 10A or a rise in the environmental temperature. Thus, this mounted position is not desirable.

In FIG. 6, a diagram 260 schematically shows a case where the "mirror-image product" is mounted on an inclined ceiling surface with the ventilation wall 58A located at the upper side. Since both the connection ventilation hole 57A and the breath ventilation hole 56A become upward holes, water poured over the opening of the connection ventilation hole 57A does not flow into the water-repellent filter 55A.

In FIG. 6, a diagram 270 schematically shows a case where the "mirror-image product" is mounted on an inclined ceiling surface with the ventilation wall 58A located at the lower side. Since both the connection ventilation hole 57A and the breath ventilation hole 56A become upward holes, water poured over the opening of the connection ventilation hole 57A does not flow into the water-repellent filter 55A. In the cases of the diagrams 260 and 270 in FIG. 6, similarly to the case of the diagram 210, it is conceivable that wetting directly with water poured by high-pressure washing is prevented by the shelf board itself or some sort of an obstacle.

When FIG. 5 and FIG. 6 are compared to each other, if either the "regular product" or the "mirror-image product" is selected for each of the various mounting directions of the waterproof type control apparatus 10A, the water-repellent filter 55A can be prevented from being wetted with water.

In the wall surface-mounted manners in the cases of the diagrams 120 and 130 in FIG. 5 and in the cases of the diagrams 220 and 230 in FIG. 6, the connector housing 50A is mounted in a direction in which the connector housing 50A is located at the upper ceiling surface side or the lower floor surface side of the casing 11A. If the connector housing 50A is mounted in a horizontal direction, since the connection ventilation hole 57A and the breath ventilation hole 56A extend horizontally, when poured water flows into the connection ventilation hole 57A, the water-repellent filter 55A is wetted with the water. However, if the connection ventilation hole 57A is made to have a large diameter and the throttling hole portion 57d having a small diameter is provided at an upper eccentric position on the connection ventilation hole 57A, a small amount of water does not flow into the throttling hole portion 57d, and therefore the water-repellent filter 55A is not wetted with water.

In the case of an inclined floor surface, if the "regular product" is used, the connection ventilation hole 57A becomes an upward hole, and in the case of an inclined ceiling surface, if the "mirror-image product" is used, the connection ventilation hole 57A becomes an upward hole, so that the water-repellent filter 55A is prevented from being wetted with water.

(3) Main Points and Features of Embodiment 1

As is obvious from the above description, the waterproof type control apparatus 10A according to Embodiment 1 of the present invention includes: the circuit board 40 that is sealed and housed in the casing 11A that includes the base 20A having the mounting surface and the cover 30A; the connector housing 50A that is a resin molded member that is mounted at the one side of the circuit board 40 and exposed from a side surface opening of the cover 30A; and the plurality of first connection terminals 52A that are press-fitted into the partition wall 51A of the connector housing 50A. The one end of each first connection terminal is connected to a circuit pattern of the circuit board 40, and the other end of each first connection terminal is connected in a contact conductive manner to the second connection terminal 14 provided within the mating connector 12A, so that the waterproof type control apparatus 10A is connected to the wire harness 60A that is outside the casing 11A. The connector housing 50A includes: the inner annular peripheral wall 53A that is provided at the inner side of the partition wall 51A; and the outer annular peripheral wall 54A that is provided at the outer side of the partition wall 51A and to which the mating connector 12A is fitted, and the waterproof packing 15 for preventing water from entering the closed space including a contact conductive portion between each first connection terminal 52A and each second connection terminal 14 is provided between an end surface portion of the outer annular peripheral wall 54A and the mating connector 12A that is fitted to the outer annular peripheral wall 54A.

The water-repellent filter 55A is fixed in a close contact manner to the inner surface of the partition wall 51A, and is a flat porous material that includes a plurality of fine pores that block entry and passing of water droplets into the casing 11A and allow the atmospheric air to freely pass therethrough. The water-repellent filter 55A includes: the inner surface portion 55*a* that communicates with the inner space of the casing 11A; and the outer surface portion 55*b* that communicates with the breath ventilation hole 56A through which the outside air is introduced. The breath ventilation hole 56A extends within the ventilation wall 58A, which is provided at a position at a side surface of the outer annular peripheral wall 54A, in a direction penetrating the partition wall 51A, is changed in direction to a direction to the mounting surface which direction is parallel to the partition wall 51A or the direction opposite to the direction to the mounting surface by the connection ventilation hole 57A, and is opened to the atmosphere. A product in which the direction changed by the connection ventilation hole 57A is the direction to the mounting surface or the direction opposite to the direction to the mounting surface is selected and used depending on the mounting environment of the base 20A such that wetting directly with water through the atmospheric opening is unlikely to occur. This relates to claim 1 of the present invention.

With such a configuration, since the water-repellent filter 55A is mounted on the inner surface of the connector housing 50A, a functional test can be conducted on the apparatus alone, and also there is an effect that the area of the water-repellent filter 55A can be increased to reduce the air pressure difference between the interior and the exterior, as compared to the case where the water-repellent filter 55A is provided within the mating connector 12A.

In addition, the mounting structure becomes simpler and cheaper than conventional one in which a water-repellent filter is provided to a specially provided intermediate wall of a cover, so that there is an effect that a cover made of a resin or a sheet metal can be used.

Moreover, as the direction changed by the connection ventilation hole 57A, the direction to the mounting surface or the direction opposite to the direction to the mounting surface can be used when a position where an insert mold is inserted is changed, so that there is an effect that it is possible to handle the mounting environment such that wetting directly with water from the atmospheric opening surface is easily avoided.

Furthermore, a ventilation path including the breath ventilation hole 56A and the connection ventilation hole 57A has a complicated and long shape, and is disposed such that either the breath ventilation hole 56A or the connection ventilation hole 57A becomes an upward hole, so that there is an effect that the water-repellent filter 55A can be avoided from being wetted directly with water. In addition, the structure of the breath ventilation hole 56A and the connection ventilation hole 57A does not depend on the structure of the mating connector 12A. Thus, the mating connector 12A can be used in common for the connector housing 50A in which the water-repellent filter 55A is mounted and a conventional-type connector housing in which a water-repellent filter is not mounted, so that there is an economical effect that it is not necessary to additionally produce a new mold.

In the waterproof type control apparatus 10A according to Embodiment 1 of the present invention, further, the outer annular peripheral wall is the single outer annular peripheral wall 54A, the mating connector is also the single mating connector 12A, and the ventilation wall 58A provided at the position at the side surface of the outer annular peripheral wall 54A is provided at a position away from an outer wall surface of the outer annular peripheral wall 54A, or is provided at a position that is at a depth portion of the inserted mating connector 12A and is away from an opening end of the outer annular peripheral wall 54A, such that insertion of the mating connector 12A is not hindered.

As described above, in connection with claim 2 of the present invention, the ventilation wall 58A in which the breath ventilation hole 56A and the connection ventilation hole 57A are provided is restricted to a position where insertion of the mating connector 12A is not hindered. Therefore, the ventilation wall 58A can be provided adjacently to the vicinity of connection with the mating connector 12A that is provided at an advantageous location where consideration is given such that wetting directly with water is avoided.

In the waterproof type control apparatus 10A according to Embodiment 1 of the present invention, further, the plurality of first connection terminals 52A are arranged at a plurality of upper and lower stages in a direction orthogonal to the board surface of the circuit board 40, the breath ventilation hole 56A includes the first ventilation hole 56*a* and the second ventilation hole 56*b* that are arranged in a vertical direction orthogonal to the board surface of the circuit board 40 or in a horizontal direction parallel to the board surface, ends of the first and second ventilation holes 56*a* and 56*b* communicate with the outer surface portion 55*b* of the water-repellent filter 55A, and the other ends of the first and second ventilation holes 56*a* and 56*b* are orthogonally changed in direction via the first connection ventilation hole 57*a* and the second connection ventilation hole 57*b* and are opened to the atmosphere.

As described above, in connection with claim 3 of the present invention, the first and second ventilation holes 56*a* and 56*b* that communicate with the outer surface portion 55*b* of the water-repellent filter 55A are provided so as to be arranged in the vertical direction or the horizontal direction, and are orthogonally changed in direction by the first and second connection ventilation holes 57*a* and 57*b* and are opened to the atmosphere. Therefore, even when clogging of one ventilation hole occurs, ventilation can be performed by the other ventilation hole, so that the reliability improves.

In the waterproof type control apparatus 10A according to Embodiment 1 of the present invention, further, the throttling hole portion 57*d* is provided such that the hole diameter of the connection ventilation hole 57A is small at the position where the connection ventilation hole 57A communicates with the breath ventilation hole 56A to orthogonally change the direction of the breath ventilation hole 56A.

As described above, in connection with claim 4 of the present invention, the throttling hole portion is provided at a depth portion of the connection ventilation hole 57A that communicates with the breath ventilation hole 56A. Therefore, in the case where, due to the mounting environment of the waterproof type control apparatus 10A, the connection ventilation hole 57A is made horizontal or slightly inclined from a horizontal position such that the water-repellent filter 55A is located at a lower position, a portion for accumulating poured water having flowed in is generated, so that the poured water can be prevented from flowing into the water-repellent filter 55A.

Water accumulated within the connection ventilation hole 57A is dried and evaporated some time later.

In the case where the mounting surface for the waterproof type control apparatus 10A is greatly inclined so that the opening of the connection ventilation hole 57A is wetted directly with water, by using one in which the direction of the connection ventilation hole 57A is changed, wetting directly with water is avoided, and by the connection ventilation hole 57A becoming an upward hole, water is prevented from flowing into the water-repellent filter 55A.

The same also applies to Embodiment 2.

In the waterproof type control apparatus 10A according to Embodiment 1 of the present invention, further, the throttling hole portion 57d is located eccentrically from the central position of the connection ventilation hole 57A, and is located eccentrically in such a direction that the portion for accumulating poured water is widened, in response to a predetermined mounting inclination angle.

As described above, in connection with claim 5 of the present invention, the amount of poured water accumulated in the connection ventilation hole 57A can be easily increased when an insert mold corresponding to a mounting inclination angle of the base 20A is used.

The same also applies to Embodiment 2.

In the waterproof type control apparatus 10A according to Embodiment 1 of the present invention, further, the fine hole 59 is provided in the inner surface of the outer annular peripheral wall 54A so as to communicate with the inner space of the casing 11A.

As described above, in connection with claim 6 of the present invention, breathing between the interior of the casing 11A and the outside air caused by the temperature difference between the interior and the exterior of the casing 11A can be performed freely via the water-repellent filter 55A, not via a small space in the connector portion connected to the mating connector 12A. In addition, breathing can also be performed via the inner space of the casing 11A also with respect to a closed space of the connector portion to which the mating connector 12A is connected.

When the mating connector 12A is inserted or pulled out, occurrence of insertion/pulling-out resistance caused by air resistance can be suppressed. In addition, in a single product state where the mating connector 12A is not attached, dust can be prevented from freely entering through the opening surface of the connector.

The same also applies to Embodiment 2.

Embodiment 2

(1) Detailed Description of Configuration and Effects/Operation

Hereinafter, the difference from FIGS. 1 to 5 of Embodiment 1 will be mainly described in detail. In each drawing, the same reference numerals denote the same or equivalent portions.

The main difference from Embodiment 1 is that an outer annular peripheral wall 54B of a connector housing 50B is divided into first and second annular peripheral walls 54a and 54b and first and second groups of first connection terminals 52a and 52b are pressed-fitted and held by a partition wall 51B.

Figure 9:
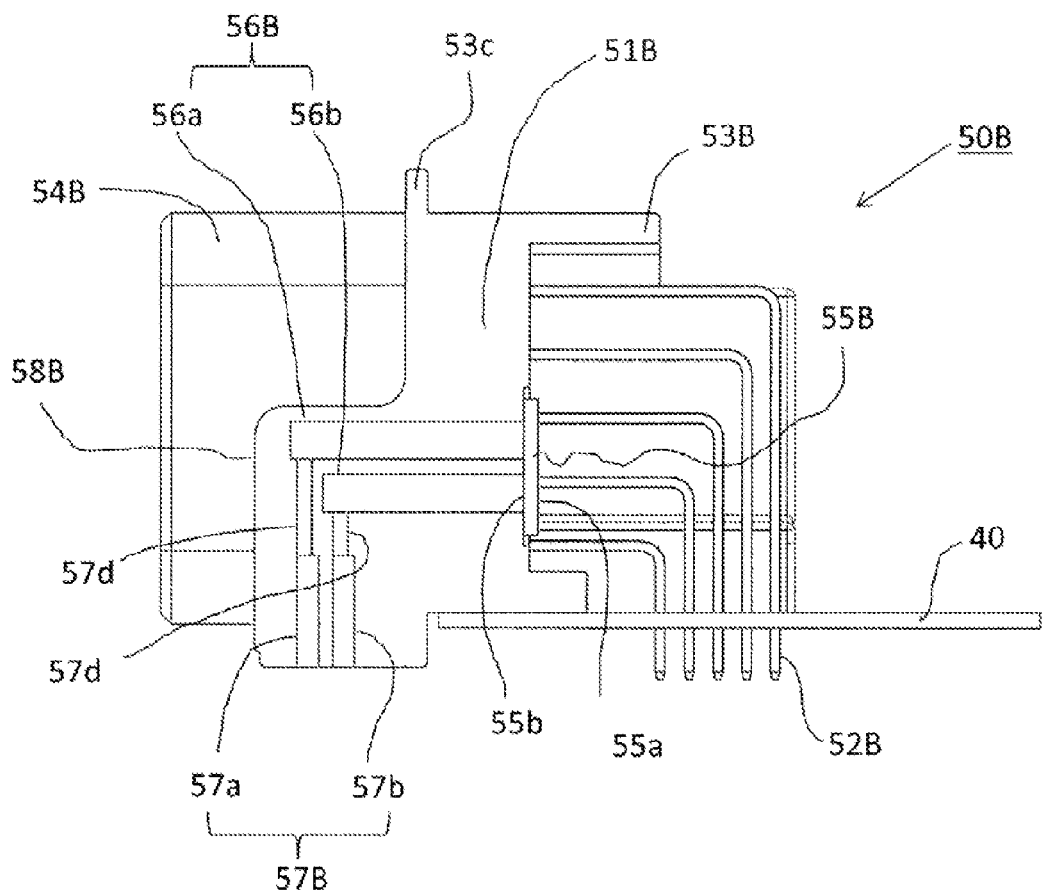
FIG. 9 is a detailed cross-sectional view of a connector housing in FIG. 7.

In an external view of a waterproof type control apparatus 10B in FIG. 7, a casing 11B includes: a base 20B that has mounting legs at four sides thereof and is made of an aluminum die casting or a sheet metal; and a cover 30B that is made of a resin or a sheet metal, a circuit board 40 on which the connector housing 50B described later with reference to FIG. 9 is mounted is sealed and housed in the casing 11B, and parts of the connector housing 50B are exposed from the casing 11B.

A mating connector 12B that is divided and formed by first and second mating connectors 12a and 12b is inserted into the exposed parts of the connector housing 50B so as to establish connections with external apparatuses via a wire harness 60B that includes first and second wire harnesses 60a and 60b, respectively.

The connector housing 50B, which is made of the resin, is configured by replacing the character A shown in FIG. 2 with character B, and includes an inner annular peripheral wall 53B and the outer annular peripheral wall 54B that are provided laterally to the partition wall 51B. The mating connector 12B is attached to the outer annular peripheral wall 54B that is at the side of exposure from the casing 11B. Three sides of the outer periphery of the inner annular peripheral wall 53B are in contact with an opening surface of the cover 30B in FIG. 7 via a waterproof sealing material that is not shown, the remaining one side of the outer periphery is in contact with one side of the base 20B via the waterproof sealing material that is not shown, and an annular projection 53c for preventing outflow of the waterproof sealing material is provided at a position where the interior and the exterior are separated by the partition wall 51B. A plurality of first connection terminals 52B are press-fitted and fixed to the partition wall 51B, and each are configured such that one end thereof is orthogonally converted and soldered to the circuit board 40 described later with reference to FIG. 9, and the other end thereof is brought into electrically conductive contact with a second connection terminal 14 provided in the mating connector 12B.

The partition wall 51B is provided with a fine hole 59 (not shown) that provides communication between the inner space of the casing 11B and a sealed space at the connector side.

Similarly as described above with reference to FIG. 2, the mating connector 12B has annular spaces each defined by: an inner body portion 12x into which a plurality of second connection terminals 14 are inserted; and an outer peripheral wall 12y surrounding the inner body portion 12x, and is configured such that the outer annular peripheral wall 54B of the connector housing 50B is inserted in each annular space. A waterproofing mechanism that is not shown is provided at a position where the mating connector 12B and the wire harness 60B in FIG. 7 are received, and waterproofness between the mating connector 12B and the connector housing 50B is provided by a waterproof packing 15 that is disposed on the inner peripheral surface of the outer annular peripheral wall 54B and the outer periphery of the inner body portion 12x.

Figure 7:
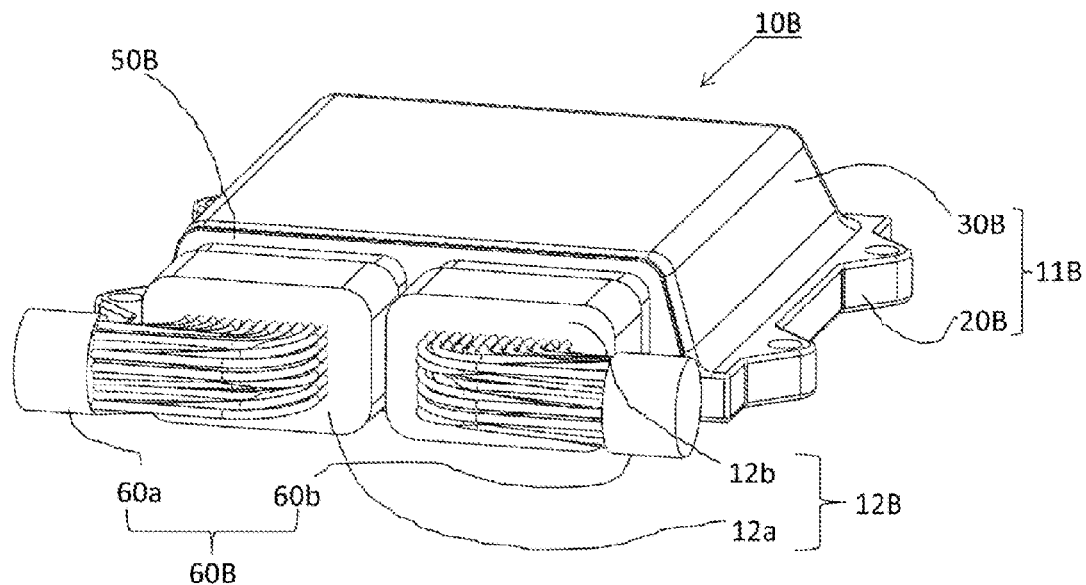
FIG. 7 is an external view of a waterproof type control apparatus according to Embodiment 2 of the present invention.
Figure 8:
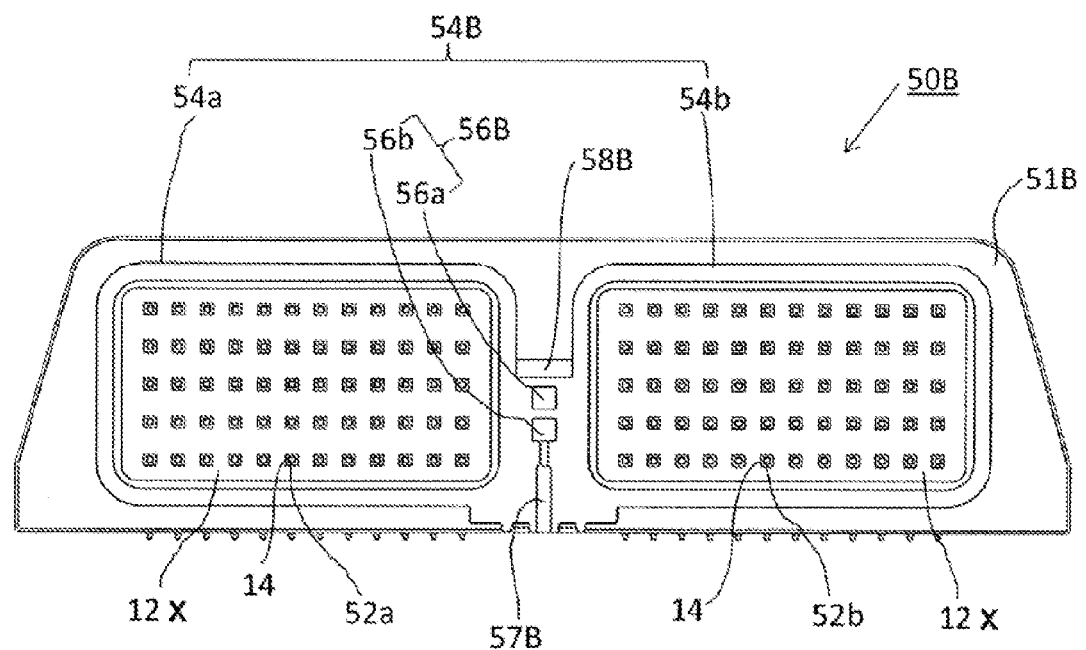
FIG. 8 is a plan view of a connector connection portion in FIG. 7.

FIG. 8 is a plan view of a connector connection portion in FIG. 7. In FIG. 8, the plurality of second connection terminals 14 described above with reference to FIG. 2 are inserted into the inner body portions 12x of the first and second mating connectors 12a and 12b, and the first and second groups of first connection terminals 52a and 52b that are first connection terminals 52B are inserted into the second connection terminals 14.

Although the outer peripheral walls 12y of the mating connector 12B are present on the outer peripheries of the first and second annular peripheral walls 54a and 54b that form the outer annular peripheral wall 54B, the position of the cross-section in FIG. 8 is a position where the outer peripheral walls 12y are not present.

Within an ventilation wall 58B that projects outward from the partition wall 51B of the connector housing 50B, a breath ventilation hole 56B including first and second ventilation holes 56a and 56b described later with reference to FIG. 9 is provided, and a connection ventilation hole 57B including first and second connection ventilation holes 57a and 57b at the respective ventilation holes is provided. However, either one of the first and second ventilation holes 56a and 56b may be omitted. Accordingly, either one of the first and second connection ventilation holes 57a and 57b may be omitted. In addition, the first and second ventilation holes 56a and 56b are arranged in the up-down direction, but may be arranged in the right-left direction.

FIG. 9 is a detailed cross-sectional view of the connector housing in FIG. 7. In FIG. 9, the connector housing 50B is fixed to one side of the circuit board 40, and the plurality of right-angle-type first connection terminals 52B are soldered thereto.

The first connection terminals 52B are divided into the first and second groups of first connection terminals 52a and 52b. A water-repellent filter 55B is bonded and fixed to an inner wall surface of the partition wall 51B of the connector housing 50B to which the plurality of first connection terminals 52B are press-fitted and fixed, and is a flat porous material that has an inner surface portion 55a and an outer surface portion 55b and has a circular shape, a square shape, or an elliptical shape.

The inner surface portion 55a of the water-repellent filter 55B is fully opened to the inner space of the casing 11B, and the outer surface portion 55b is fully opened to the breath ventilation hole 56B, which is provided in the partition wall 51B and includes the first and second ventilation holes 56a and 56b, except for a contour outer peripheral portion of the outer surface portion 55b. The first ventilation hole 56a is opened to the atmosphere via a throttling hole portion 57d orthogonal thereto and the second connection ventilation hole 57a, and the second ventilation hole 56b is opened to the atmosphere via a throttling hole portion 57d orthogonal thereto and the second connection ventilation hole 57b. The first and second connection ventilation holes 57a and 57b form the connection ventilation hole 57B.

In Embodiment 2, the breath ventilation hole 56B is structured to extend in a direction orthogonal to the partition wall 51B and change its direction to an upward or downward direction parallel to the partition wall 51B by the connection ventilation hole 57B. However, as long as wetting with water can be prevented, the angle between the breath ventilation hole 56B and the connection ventilation hole 57B is not limited to the right angle.

The opening of the connection ventilation hole 57B in Embodiment 2 is opposed to the same plane as a mounting surface of the base 20B, and the apparatus having this configuration is referred to as "regular product". When the direction of an insert of a mold for manufacturing the connector housing 50B is made opposite, a "mirror-image product" can be produced in which the opening of the connection ventilation hole 57B is opposed to a plane in a direction opposite to the mounting surface of the base 20B (i.e., a direction to the cover 30B).

Therefore, positions of the ventilation opening with respect to various mounting angles are the same as in FIGS. 5 and 6, and if either the "regular product" or the "mirror-image product" is selected for each of the various mounting directions of the waterproof type control apparatus 10B, the water-repellent filter 55B can be prevented from being wetted with water.

Figure 10:
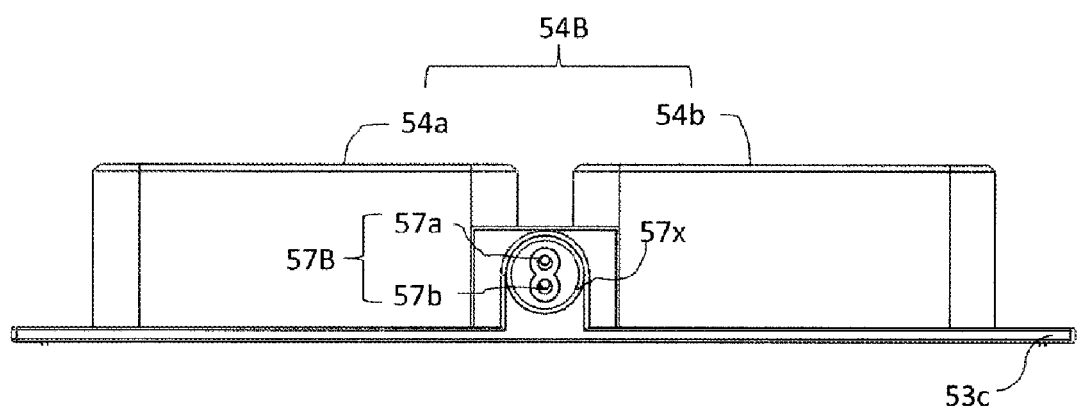
FIG. 10 is a bottom view of the connector housing in the FIG. 7.

FIG. 10 is a bottom view of the connector housing in FIG. 7. In FIG. 10, the bottom surface of the connector housing 50B is provided with an annular projection surface 57x at the outer peripheries of the atmospheric opening ends of the first and second connection ventilation holes 57a and 57b, and the height of the annular projection surface 57x is the same as the height of the annular projection 53c shown in FIG. 9. The annular projection 53c is provided at a peripheral wall of the inner annular peripheral wall 53B and serves to prevent outflow of a waterproof sealing material applied to an opening end surface of the cover 30B and one side of the base 20B.

Figure 11:
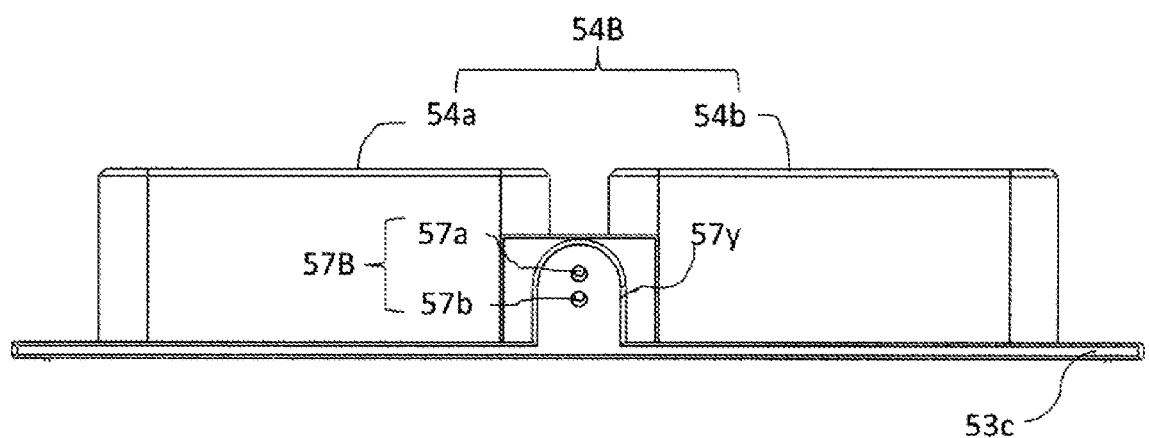
FIG. 11 is a bottom view of a connector housing according to a modification of FIG. 7.

FIG. 11 is a bottom view of a connector housing of a modification of FIG. 7. In FIG. 11, the atmospheric opening ends of the first and second connection ventilation holes 57a and 57b are provided in a plateau plane portion 57y that is a surface having the same height as that of the annular projection 53c shown in FIG. 9.

Thus, when a ventilation test is conducted on the water-repellent filter 55B, if an elastic body is provided on a contact face of a jig for closing or opening the opening end of the connection ventilation hole 57B, air-tight closing can be easily performed.

When the ventilation test is conducted on the water-repellent filter 55B, a pressurizing or depressurizing device is connected in the outer annular peripheral wall 54B of the connector housing 50B in a state where the mating connector 12B is not connected, the interior of the casing 11B is pressurized or depressurized through the fine hole 59 that is the same as in FIG. 2, and a ventilation volume is measured in a state where the opening end of the connection ventilation hole 57B is closed or opened.

(2) Main Points and Features of Embodiment 2

As is obvious from the above description, the waterproof type control apparatus 10B according to Embodiment 2 of the present invention includes: the circuit board 40 that is sealed and housed in the casing 11B that includes the base 20B having the mounting surface and the cover 30B; the connector housing 50B that is a resin molded member that is mounted at the one side of the circuit board 40 and exposed from a side surface opening of the cover 30B; and the plurality of first connection terminals 52B that are press-fitted into the partition wall 51B of the connector housing 50B. The one end of each first connection terminal 52B is connected to a circuit pattern of the circuit board 40, and the other end of each first connection terminal 52B is connected in a contact conductive manner to the second connection terminal 14 provided within the mating connector 12B, so that the waterproof type control apparatus 10B is connected to the wire harness 60B that is outside the casing 11B. The connector housing 50B includes: the inner annular peripheral wall 53B that is provided at the inner side of the partition wall 51B; and the outer annular peripheral wall 54B that is provided at the outer side of the partition wall 51B and to which the mating connector 12B is fitted, and the waterproof packing 15 for preventing water from entering the closed space including a contact conductive portion between each first connection terminal 52B and each second connection terminal 14 is provided between an end surface portion of the outer annular peripheral wall 54B and the mating connector 12B that is fitted to the outer annular peripheral wall 54B.

The water-repellent filter 55B is fixed in a close contact manner to the inner surface of the partition wall 51B, and is a flat porous material that includes a plurality of fine pores that block entry and passing of water droplets into the casing 11B and allow the atmospheric air to freely pass therethrough. The water-repellent filter 55B includes: the inner surface portion 55a that communicates with the inner space of the casing 11B; and the outer surface portion 55b that communicates with the breath ventilation hole 56B through which the outside air is introduced. The breath ventilation hole 56B extends within the ventilation wall 58B, which is provided at a position at a side surface of the outer annular peripheral wall 54B, in a direction penetrating the partition wall 51B, is changed in direction to a direction to the mounting surface which direction is parallel to the partition wall 51B or the direction opposite to the direction to the mounting surface by the connection ventilation hole 57B, and is opened to the atmosphere. A product in which the direction changed by the connection ventilation hole 57B is the direction to the mounting surface or the direction opposite to the direction to the mounting surface is selected and used depending on the mounting environment of the base 20B such that wetting directly with water through the atmospheric opening is unlikely to occur. This relates to claim 1 of the present invention.

With such a configuration, since the water-repellent filter 55B is mounted on the inner surface of the connector housing 50B, a functional test can be conducted on the apparatus alone, and also there is an effect that the area of the water-repellent filter 55B can be increased to reduce the air pressure difference between the interior and the exterior, as compared to the case where the water-repellent filter 55B is provided within the mating connector 12B.

In addition, the mounting structure becomes simpler and cheaper than conventional one in which a water-repellent filter is provided to a specially provided intermediate wall of a cover, so that there is an effect that a cover made of a resin or a sheet metal can be used.

Moreover, as the direction changed by the connection ventilation hole 57B, the direction to the mounting surface or the direction opposite to the direction to the mounting surface can be used when a position where an insert mold is inserted is changed, so that there is an effect that it is possible to handle the mounting environment such that wetting directly with water from the atmospheric opening surface is easily avoided.

Furthermore, a ventilation path including the breath ventilation hole 56B and the connection ventilation hole 57B has a complicated and long shape, and is disposed such that either the breath ventilation hole 56B or the connection ventilation hole 57B becomes an upward hole, so that there is an effect that the water-repellent filter 55B can be avoided from being wetted directly with water. In addition, the structure of the breath ventilation hole 56B and the connection ventilation hole 57B does not depend on the structure of the mating connector 12B. Thus, the mating connector 12B can be used in common for the connector housing 50B in which the water-repellent filter 55B is mounted and a conventional-type connector housing in which a water-repellent filter is not mounted, so that there is an economical effect that it is not necessary to additionally produce a new mold.

In the waterproof type control apparatus 10B according to Embodiment 2 of the present invention, further, the outer annular peripheral wall is the division-type outer annular peripheral wall 54B that is divided into at least the first and second annular peripheral walls 54a and 54b, the mating connector is also the division-type connector 12B that is divided into at least the first and second mating connectors 12a and 12b, and the ventilation wall 58B is provided at an intermediate position between the first and second annular peripheral walls 54a and 54b, and is provided at a position away from an outer wall surface of the outer annular peripheral wall 54B, or is provided at a position that is at a depth portion of the inserted mating connector 12B and is away from an opening end of the outer annular peripheral wall 54B, such that insertion of the mating connector 12B is not hindered.

As described above, in connection with claim 2 of the present invention, the ventilation wall 58B in which the breath ventilation hole 56B and the connection ventilation hole 57B are provided is restricted to a position where insertion of the mating connector 12B is not hindered. Therefore, the ventilation wall 58B can be provided adjacently to the vicinity of connection with the mating connector 12B that is provided at an advantageous location where consideration is given such that wetting directly with water is avoided.

In addition, since the ventilation wall 58B is provided at the intermediate position between the first and second annular peripheral walls 54a and 54b, the breath ventilation hole 56B and the connection ventilation hole 57B are present between the right and left mating connectors 12B and are more unlikely to be wetted directly with water.

In the waterproof type control apparatus 10B according to Embodiment 2 of the present invention, further, the plurality of first connection terminals 52B are arranged at a plurality of stages in a direction orthogonal to the board surface of the circuit board 40, the breath ventilation hole 56B includes the first ventilation hole 56a and the second ventilation hole 56b that are arranged in a vertical direction orthogonal to the board surface of the circuit board 40 or in a horizontal direction parallel to the board surface, ends of the first and second ventilation holes 56a and 56b communicate with the outer surface portion 55b of the water-repellent filter 55B, and the other ends of the first and second ventilation holes 56a and 56b are orthogonally changed in direction via the first connection ventilation hole 57a and the second connection ventilation hole 57b and are opened to the atmosphere.

As described above, in connection with claim 3 of the present invention, the first and second ventilation holes 56a and 56b that communicate with the outer surface portion 55b of the water-repellent filter 55B are provided so as to be arranged in the vertical direction or the horizontal direction, and are orthogonally changed in direction by the first and second connection ventilation holes 57a and 57b and opened to the atmosphere. Therefore, even when clogging of one ventilation hole occurs, ventilation can be performed by the other ventilation hole, so that the reliability improves.

Furthermore, by effectively utilizing a small space between the first and second annular peripheral walls 54a and 54b, the first and second ventilation holes 56a and 56b that are paired can be provided.

In the waterproof type control apparatus 10B according to Embodiment 2 of the present invention, further, the opening end of the connection ventilation hole 57B has the annular projection surface 57x surrounding the connection ventilation hole 57B, or the connection ventilation hole 57B is exposed in the plateau plane portion 57y located at a higher position than the surrounding portion.

As described above, in connection with claim 7 of the present invention, when a ventilation test is conducted on the water-repellent filter 55B, if an elastic body is provided on a contact face of a jig for closing or opening the opening end of the connection ventilation hole 57B, air-tight closing can be easily performed.

The same also applies to Embodiment 1.

In the waterproof type control apparatus 10B according to Embodiment 2 of the present invention, further, the annular projection 53c for preventing outflow of the waterproof sealing material applied to the opening end surface of the cover 30B and the one side of the base 20B is provided at a peripheral wall portion of the inner annular peripheral wall 53B, and the annular projection surface 57x or the plateau plane portion 57y is equal to or greater in height dimension than the annular projection 53c and is connected and integrated with the annular projection 53c.

As described above, in connection with claim 8 of the present invention, the annular projection surface 57x or the plateau plane portion 57y serves as a part of the annular projection 53c for preventing outflow of the sealing material, and a jig for a ventilation test can be provided in the small space.

The same also applies to Embodiment 1.

It is noted that, within the scope of the present invention, the above embodiments may be freely combined with each other, or each of the above embodiments may be modified or abbreviated as appropriate.

DESCRIPTION OF THE REFERENCE CHARACTERS 10A, 10B waterproof type control apparatus
11A, 11B casing
12A, 12B mating connector
12x inner body portion
12y outer peripheral wall
14 second connection terminal
15 waterproof packing
20A, 20B base
30A, 30B cover
40 circuit board
50A, 50B connector housing
51A, 51B partition wall
52A, 52B first connection terminal
53A, 53B inner annular peripheral wall
54A, 54B outer annular peripheral wall
55A, 55B water-repellent filter
55a inner surface portion
55b outer surface portion
56A, 56B breath ventilation hole
57A, 57B connection ventilation hole
57d throttling hole portion
57x annular projection surface
57y plateau plane portion
58A, 58B ventilation wall
59 fine hole
60A, 60B wire harness

What is claimed is:

1. A waterproof type control apparatus comprising:
a circuit board sealed and housed in a casing including a cover and a base having a mounting surface;
a connector housing which is a resin molded member mounted at one side of the circuit board and exposed from a side surface opening of the cover; and
a plurality of first connection terminals press-fitted into a partition wall of the connector housing, wherein
one end of each first connection terminal is connected to a circuit pattern of the circuit board, and another end of each first connection terminal is connected in a contact conductive manner to a second connection terminal provided within a mating connector, so that the waterproof type control apparatus is connected to a wire harness which is outside the casing,
the connector housing includes an inner annular peripheral wall provided at an inner side of the partition wall, and an outer annular peripheral wall which is provided at an outer side of the partition wall and to which the mating connector is fitted,
a waterproof packing for preventing water from entering an closed space including a contact conductive portion between each first connection terminal and each second connection terminal is provided between an end surface portion of the outer annular peripheral wall and the mating connector fitted to the outer annular peripheral wall,
a water-repellent filter which is a flat porous material including a plurality of fine pores which block entry and passing of water droplets into the casing and allow atmospheric air to freely pass therethrough is fixed in a close contact manner to an inner surface of the partition wall,
the water-repellent filter includes an inner surface portion communicating with an inner space of the casing and an outer surface portion communicating with a breath ventilation hole through which outside air is introduced,
the breath ventilation hole extends within a ventilation wall provided at a position at a side surface of the outer annular peripheral wall, in a direction penetrating the partition wall, is changed in direction to a direction to the mounting surface, which direction is parallel to the partition wall, or a direction opposite to the direction to the mounting surface by a connection ventilation hole, and is opened to atmosphere, and
a product in which the direction changed by the connection ventilation hole is the direction to the mounting surface or the direction opposite to the direction to the mounting surface is selected and used depending on a mounting environment of the base such that wetting directly with water through an atmospheric opening is unlikely to occur.

2. The waterproof type control apparatus according to claim 1, wherein
the outer annular peripheral wall is a single outer annular peripheral wall or a division type outer annular peripheral wall divided into at least first and second annular peripheral walls,
the mating connector is also a single mating connector or a division type mating connector divided into at least first and second mating connectors,
if the first and second annular peripheral walls are included, the ventilation wall provided at the position at the side surface of the outer annular peripheral wall is provided at an intermediate position between the first and second annular peripheral walls, and
the ventilation wall is provided at a position away from an outer wall surface of the outer annular peripheral wall, or is provided at a position which is at a depth portion of the inserted mating connector and is away from an opening end of the outer annular peripheral wall, such that insertion of the mating connector is not hindered.

3. The waterproof type control apparatus according to claim 1, wherein
the plurality of first connection terminals are arranged at a plurality of stages in a direction orthogonal to a board surface of the circuit board, the breath ventilation hole includes a first ventilation hole and a second ventilation hole which are located in a vertical direction orthogonal to the board surface of the circuit board or a horizontal direction parallel to the board surface, and ends of the first and second ventilation holes communicate with the outer surface portion of the water-repellent filter, and other ends of the first and second ventilation holes are orthogonally changed in direction via a first connection ventilation hole and a second connection ventilation hole and are opened to the atmosphere.

4. The waterproof type control apparatus according to claim 1, wherein a throttling hole portion is provided such that a hole diameter of the connection ventilation hole is small at a position where the connection ventilation hole communicates with the breath ventilation hole to orthogonally change the direction of the breath ventilation hole.

5. The waterproof type control apparatus according to claim 4, wherein the throttling hole portion is located eccentrically from a central position of the connection ventilation hole, and is located eccentrically in such a direction that a portion for accumulating poured water is widened, in response to a predetermined mounting inclination angle.

6. The waterproof type control apparatus according to claim 1, wherein an inner surface of the outer annular peripheral wall is provided with a fine hole communicating with the inner space of the casing.

7. The waterproof type control apparatus according to claim 1, wherein an opening end of the connection ventilation hole has an annular projection surface surrounding the connection ventilation hole, or the connection ventilation hole is exposed in a plateau plane portion located at a higher position than a surrounding portion.

8. The waterproof type control apparatus according to claim 7, wherein an annular projection for preventing outflow of a waterproof sealing material applied to an opening end surface of the cover and one side of the base is provided at a peripheral wall portion of the inner annular peripheral wall, and the annular projection surface or the plateau plane portion is equal to or greater in height dimension than the annular projection and is connected and integrated with the annular projection.

* * * * *